(12) United States Patent
Yoshino

(10) Patent No.: US 10,886,267 B2
(45) Date of Patent: Jan. 5, 2021

(54) REFERENCE VOLTAGE GENERATION DEVICE

(71) Applicant: ABLIC Inc., Chiba (JP)

(72) Inventor: Hideo Yoshino, Chiba (JP)

(73) Assignee: ABLIC INC., Chiba (JP)

( * ) Notice: Subject to any disclaimer, the term of this patent is extended or adjusted under 35 U.S.C. 154(b) by 13 days.

(21) Appl. No.: 16/240,428

(22) Filed: Jan. 4, 2019

(65) Prior Publication Data
US 2019/0244956 A1 Aug. 8, 2019

(30) Foreign Application Priority Data
Feb. 6, 2018 (JP) .................................. 2018-019334

(51) Int. Cl.
| | | |
|---|---|---|
| *H01L 27/088* | (2006.01) | |
| *H01L 29/10* | (2006.01) | |
| *H01L 29/78* | (2006.01) | |
| *G05F 3/16* | (2006.01) | |
| *G05F 3/24* | (2006.01) | |
| *H01L 21/8234* | (2006.01) | |

(52) U.S. Cl.
CPC ............ *H01L 27/0883* (2013.01); *G05F 3/16* (2013.01); *G05F 3/242* (2013.01); *H01L 29/1033* (2013.01); *H01L 29/78* (2013.01); *H01L 29/7838* (2013.01); *H01L 21/823412* (2013.01)

(58) Field of Classification Search
None
See application file for complete search history.

(56) References Cited

U.S. PATENT DOCUMENTS

2009/0146731 A1* 6/2009 Yoshida .............. H01L 27/0883
327/543
2013/0207636 A1* 8/2013 Yoshino .................... G05F 3/24
323/313

FOREIGN PATENT DOCUMENTS

| JP | 2003-031678 A | 1/2003 |
|---|---|---|
| JP | 2007-206972 A | 8/2007 |

* cited by examiner

*Primary Examiner* — Jay C Chang
(74) *Attorney, Agent, or Firm* — Brinks Gilson & Lione

(57) ABSTRACT

The reference voltage generation device includes a constant current circuit which includes a first MOS transistor, and a voltage generation circuit which includes a second MOS transistor. The first MOS transistor includes a gate electrode, a source region, a drain region, and a channel impurity region which have a first conductivity type and has a first channel size. The second MOS transistor includes a gate electrode of a second conductivity type, and a source region, a drain region, and a channel impurity region which have the first conductivity type and has a second channel size different from the first channel size. The channel impurity regions have different impurity concentrations.

2 Claims, 6 Drawing Sheets

REFERENCE VOLTAGE GENERATION DEVICE

RELATED APPLICATIONS

This application claims priority under 35 U.S.C. § 119 to Japanese Patent Application No. 2018-019334 filed on Feb. 6, 2018, the entire content of which is hereby incorporated by reference.

BACKGROUND OF THE INVENTION

1. Field of the Invention

The present invention relates to a reference voltage generation device.

2. Description of the Related Art

Expansion of the range for the operating temperature of ICs is expected along the future spread of IoT where ICs are installed in various products. In order to suppress malfunction caused by temperature change, variation of the reference voltage provided from the reference voltage generation device included in an IC is hence desired to be sufficiently small against temperature change.

A reference voltage generation device configured to generate a constant reference voltage based on the value of a constant current provided from a constant current circuit and supplied to a voltage generation circuit is frequently used in an IC. The reference voltage generation device has a circuit configuration in which characteristic fluctuations caused by temperature change (hereinafter referred to as "temperature-related fluctuations") of the constant current circuit and of the voltage generation circuit coincide so that the temperature-related fluctuations are cancelled, suppressing the temperature-related fluctuation of the reference voltage.

In Japanese Patent Application Laid-open No. 2003-31678, there is disclosed a technology of adjusting the structure of a depletion MOS transistor in order to suppress temperature-related fluctuation of the reference voltage within the temperature range of the specifications, in the combination of the depletion MOS transistor which provides a constant current and an enhancement MOS transistor which generates a constant voltage.

In Japanese Patent Application Laid-open No. 2007-206972, there is disclosed a technology of suppressing temperature-related fluctuation of the reference voltage of a reference voltage generation device constructed from a depletion MOS transistor and an enhancement MOS transistor of which polarity of the gate electrodes are N type and P type respectively, and the channel impurity distributions are the same, by adjusting the ratio of channel sizes based on the channel lengths and channel widths of the transistors.

A reference voltage generation device described in Japanese Patent Application Laid-open No. 2003-31678 is constructed from a combination of a depletion MOS transistor in which the channel is formed deep below the surface of the semiconductor substrate (this type of channel is hereinafter referred to as "buried channel") and an enhancement MOS transistor in which the channel is formed on the surface of the semiconductor substrate (this type of channel is hereinafter referred to as "surface channel"), and outputs a reference voltage Vref.

In the reference voltage Vref, the slope of the linear component in temperature-related fluctuation (hereinafter referred to as "linear component"), shown as a component Vref1 of FIG. 4, of the reference voltage can be decreased within the temperature range of the specifications. It is, however, difficult to reduce ΔVref1 which is a deviation of the reference voltage Vref from the linear component Vref1 in temperature-related fluctuation (hereinafter referred to as "deviation from the linear component"), in addition to decreasing the slope of Vref1. This is mainly due to the presence of the deviation from the linear component such as ΔVTE1 and ΔVTD1 of FIG. 3 in the threshold voltages VTE1 and VTD1. The deviation from the linear component of the threshold voltage is considered to relate to depletion layer extension and Fermi level of each of the depletion MOS transistor and the enhancement MOS transistor.

The enhancement MOS transistor and the depletion MOS transistor in Japanese Patent Application Laid-open No. 2007-206972 employ the same buried channel so that the deviations from the linear component of the threshold voltages can be made coincident.

However, the slopes of the linear components of threshold voltages do not coincide due to the difference of the flat band voltages caused by the difference in polarity of the gate electrodes of the both transistors. Change of the channel size ratio in order to make the slopes of the linear components coincident generates a deviation from the linear component of the reference voltage based on the deviations from the linear component of the threshold voltages of the both transistors. Accordingly, though it is possible to decrease the slope of the linear component of the reference voltage provided by the reference voltage generation device, a reduction of the deviation from the linear component of the reference voltage is difficult to accomplish.

SUMMARY OF THE INVENTION

In view of the above, an object of the present invention is to provide a reference voltage generation device capable of reducing temperature-related fluctuations of a reference voltage by combining a constant current circuit and a voltage generation circuit to suppress the slope of a linear component and the deviation from the linear component.

A reference voltage generation device according to the present invention is configured as follows.

That is, there is provided a reference voltage generation device, including: a constant current circuit configured to output a constant current in response to an input voltage; and a voltage generation circuit configured to generate a voltage based on the constant current, in which the constant current circuit includes a first MOS transistor having a first channel size, and including a first gate electrode of a first conductivity type, a first source region of the first conductivity type, a first drain region of the first conductivity type, and a first channel impurity region of the first conductivity type, in which the voltage generation circuit includes a second MOS transistor having a second channel size, and including a second gate electrode of a second conductivity type, a second source region of the first conductivity type, a second drain region of the first conductivity type, and a second channel impurity region of the first conductivity type, and in which the first channel size and the second channel size differ from each other, and the first channel impurity region and the second channel impurity region have different impurity concentrations.

According to the present invention, the slope of a linear component of a reference voltage provided from the reference voltage generation device is suppressed by adjusting the ratio of the channel size of an enhancement MOS transistor and the channel size of a depletion MOS transistor.

A deviation from the linear component of the reference voltage is also decreased by adjusting the ratio of the impurity concentration of the channel impurity region in the enhancement MOS transistor and the impurity concentration of the channel impurity region in the depletion MOS transistor. With those adjustments, the reference voltage generation device which provides a reference voltage with reduced temperature-related fluctuations is implemented.

DETAILED DESCRIPTION OF THE PREFERRED EMBODIMENTS

An embodiment of the present invention is described in detail below with reference to the drawings. The drawings referred to in the following description may omit some parts for easier understanding of features of the present invention and may accordingly differ from the actual device.

Figure 1:
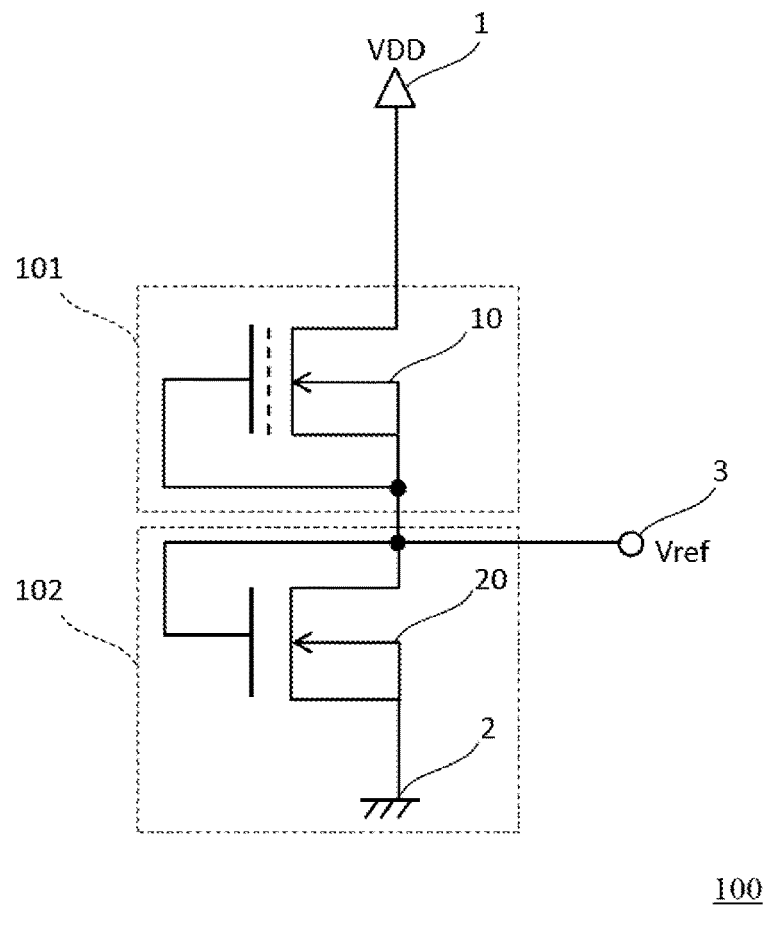
FIG. 1 is a circuit diagram for illustrating a reference voltage generation device according to an embodiment of the present invention.

FIG. 1 is a circuit diagram for illustrating a reference voltage generation device 100 according to the embodiment of the present invention.

The reference voltage generation device 100 according to this embodiment includes a constant current circuit 101 and a voltage generation circuit 102. The constant current circuit 101 which is connected to a power supply terminal 1 to be supplied with a power supply voltage VDD outputs a constant current independent of the power supply voltage VDD to the voltage generation circuit 102. The voltage generation circuit 102 receives an input of the constant current supplied from the constant current circuit 101, and outputs a reference voltage Vref based on the value of the constant current from a reference voltage terminal 3.

The constant current circuit 101 in the embodiment is constructed from a depletion N-channel MOS (hereinafter abbreviated as "NMOS") transistor 10 which has a given channel size SD and has a threshold voltage of less than 0 V. The channel size SD is a value expressed by WD/LD when the channel width is given as WD and the channel length is given as LD. The depletion NMOS transistor 10 has a gate, a source, and a back-gate which are connected to the reference voltage terminal 3 and has a drain which is connected to the power supply terminal 1.

The voltage generation circuit 102 is constructed from an enhancement NMOS transistor 20 which has a given channel size SE and has a threshold voltage of 0 V or more. The channel size SE is a value expressed by WE/LE when the channel width is given as WE and the channel length is given as LE. The enhancement NMOS transistor 20 has a gate and a drain which are connected to the reference voltage terminal 3 and has a source and a back-gate which are connected to a ground terminal 2.

The circuit operation of the reference voltage generation device 100 of FIG. 1 is described next. The depletion NMOS transistor 10 from which the constant current circuit 101 is constructed has a first threshold voltage VTD and a first mutual conductance gmD (for operation in non-saturation region). A drain current ID of the depletion NMOS transistor 10 exhibits current-voltage characteristic given by Expression (1). Since the gate and source of the depletion NMOS transistor 10 are connected electrically as illustrated in FIG. 1, a gate-source voltage VG is 0 V in Expression (1). The drain current ID is accordingly a saturated drain current dependent on the first threshold voltage VTD and independent of the drain voltage. In short, this saturated drain current is the output current of the constant current circuit 101. The drain current ID can be adjusted by the channel size SD (WD/LD) which is included in gmD of Expression (1).

$$ID = \tfrac{1}{2} \cdot gmD \cdot (VG - VTD)^2 = \tfrac{1}{2} \cdot gmD \cdot (|VTD|)^2 \qquad (1)$$

The enhancement NMOS transistor 20 from which the voltage generation circuit 102 is constructed has a second threshold voltage VTE and a second mutual conductance gmE (for operation in non-saturation region). A drain current IE of the enhancement NMOS transistor 20 exhibits current-voltage characteristic given by Expression (2). With the gate and drain of the enhancement NMOS transistor 20 connected electrically and connected to the reference voltage terminal 3 as illustrated in FIG. 1, the gate-source voltage VG is the reference voltage Vref in Expression (2). The drain current IE of the enhancement NMOS transistor 20 is accordingly a current dependent on the second threshold voltage VTE and on the reference voltage Vref and is similar to a forward biased characteristic of a diode with respect to the reference voltage Vref. The drain current IE can be adjusted by the channel size SE (WE/LE) which is included in gmE of Expression (2).

$$IE = \tfrac{1}{2} \cdot gmE \cdot (VG - VTE)^2 = \tfrac{1}{2} \cdot gmE \cdot (Vref - VTE)^2 \qquad (2)$$

The reference voltage Vref is derived by equating ID in Expression (1) with IE in Expression (2) and given by Expression (3).

$$Vref = VTE + (gmD/gmE)^{1/2} \cdot |VTD| \qquad (3)$$

As Expression (3) shows, the temperature-related fluctuation of the reference voltage Vref depends on respective temperature-related fluctuations of VTE and of VTD. The term gmD/gmE in Expression (3) includes SD/SE which is the ratio of the channel size SD of the depletion NMOS transistor 10 to the channel size SE of the enhancement NMOS transistor 20. The ratio SD/SE is specifically (WD/LD)/(WE/LE) and, by adjusting the sizes independent of temperature, temperature-related fluctuations of the reference voltage Vref can be controlled.

Figure 2:
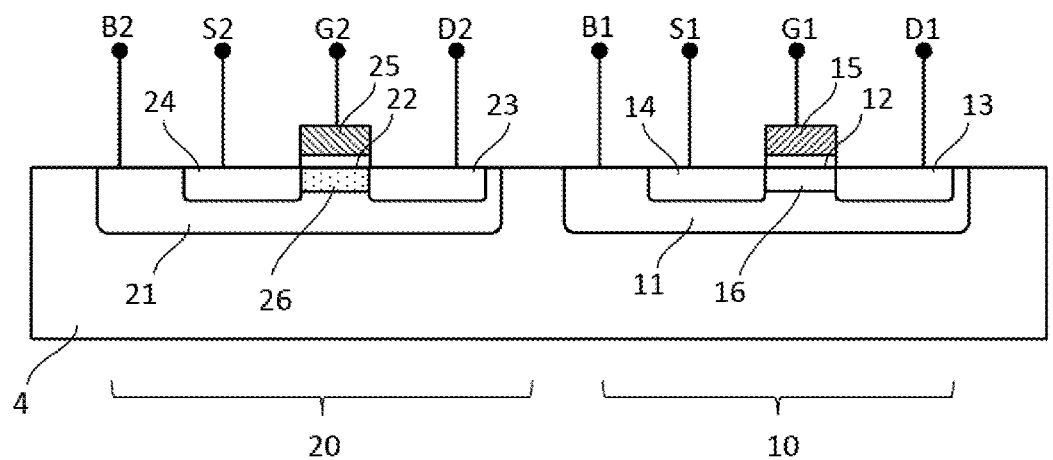
FIG. 2 is a sectional view for illustrating the reference voltage generation device according to the embodiment of the present invention.

FIG. 2 is a schematic sectional view for illustrating the structures of the depletion NMOS transistor 10 from which the constant current circuit 101 is constructed and the enhancement NMOS transistor 20 from which the voltage generation circuit 102 is constructed in FIG. 1. Electrical connections of terminals in the transistors 10 and 20 are omitted in FIG. 2.

The depletion NMOS transistor 10 includes an N type drain region 13 and an N type source region 14 which are formed in a P type well region 11 in an N type semiconductor substrate 4, an N type channel impurity region 16 which is formed between the drain region 13 and the source region 14 and which has an impurity concentration ND, a gate insulating film 12 which is formed on the channel impurity region 16, and a gate electrode 15 which is formed on the gate insulating film 12.

The source region 14 and the drain region 13 are regions containing high concentration N type impurities not less than $1 \times 10^{19}/cm^3$ (the N type region having such concentration is hereinafter referred to as "N+ type") and are connected to a source terminal S1 and a drain terminal D1, respectively. The gate electrode 15 is also N+ type and is connected to a gate terminal G1. Since the channel impurity region 16 is a region containing a low concentration N type impurities in which the impurity concentration ND is between $5 \times 10^{16}/cm^3$ and $1 \times 10^{18}/cm^3$ (the N type region having such concentration is hereinafter referred to as "N− type"), by applying a drain voltage a drain current flows from the drain terminal D1 to the source terminal S1 via the channel impurity region 16 even when the electric potential of the gate terminal G1 is 0 V. A back-gate terminal B1 is connected to the P type well region 11 via a region containing high concentration P type impurities (not shown). The back-gate terminal B1 in this embodiment is connected to the source terminal S1.

The enhancement NMOS transistor 20 includes an N type drain region 23 and an N type source region 24 which are formed in a P type well region 21 in the N type semiconductor substrate 4, an N type channel impurity region 26 which is formed between the drain region 23 and the source region 24 and which has an impurity concentration NE, a gate insulating film 22 which is formed on the channel impurity region 26, and a gate electrode 25 which is formed on the gate insulating film 22.

The source region 24 and the drain region 23 are N+ type and are connected to a source terminal S2 and a drain terminal D2, respectively. The gate electrode 25 contains high concentration P− type impurities not less than $1 \times 10^{19}/cm^3$ (the P type region having such concentration is hereinafter referred to as "P+ type"), and is connected to a gate terminal G2. The channel impurity region 26 of the enhancement NMOS transistor 20 is an N− type region which is the same as the channel impurity region 16. However, the impurity concentration NE of the channel impurity region 26 is higher than the impurity concentration ND of the channel impurity region 16. The N− type channel impurity region 26 depletes because of the work function difference from the P+ type gate electrode 25 when the electric potential of the gate terminal G2 is 0 V and the threshold voltage is 0 V or higher. Application of a drain voltage therefore causes no drain current to flow from the drain terminal D2 to the source terminal S2 when the electric potential of the gate terminal G2 is 0 V. A back-gate terminal B2 is connected to the P type well region 21 via a region containing a P type impurity in a high concentration (not shown). The back-gate terminal B2 in this embodiment is connected to the source terminal S2.

Figure 3:
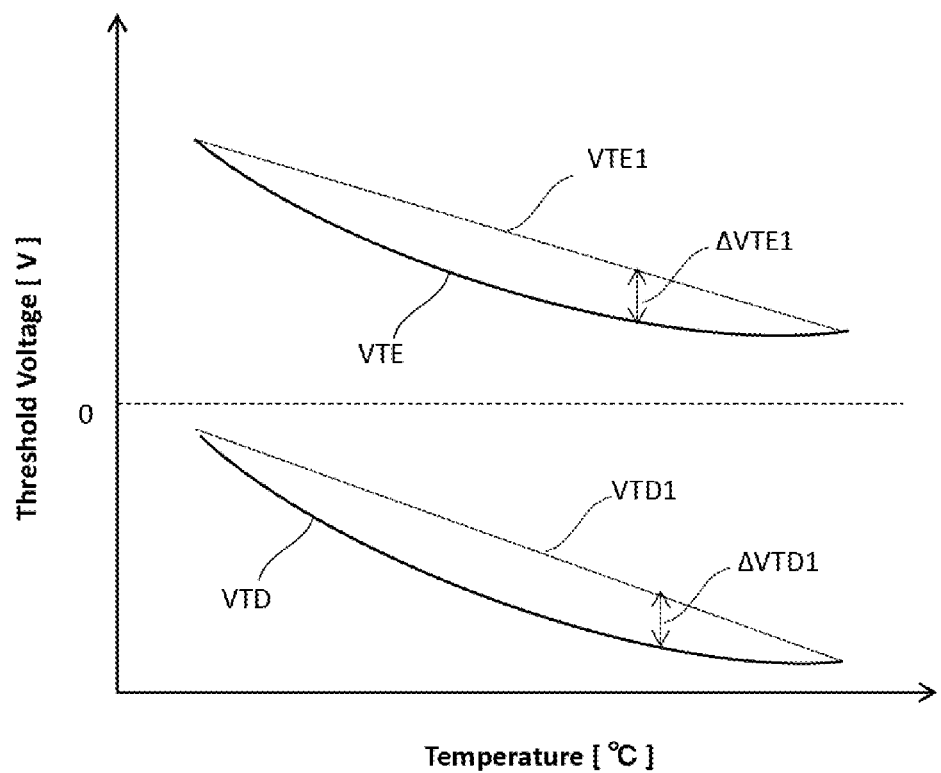
FIG. 3 is a graph for showing temperature characteristics of threshold voltages of MOS transistors.

FIG. 3 is a graph for schematically showing the behavior of the threshold voltage VTD of the depletion NMOS transistor and of the threshold voltage VTE of the enhancement NMOS transistor against temperature. As indicated by the solid lines in the graph, the threshold voltages VTD and VTE of the transistors tend to drop in response to a rise in temperature due to the effect of temperature characteristics of flat band voltages, the extension of depletion layers, Fermi levels, and other factors which are included in the threshold voltages VTD and VTE.

Temperature-related fluctuations of the threshold voltage VTD of the depletion NMOS transistor includes a linear component VTD1 and a deviation from the linear component ΔVTD1. The linear component VTD1 is represented by the dotted line having a constant slope along which the threshold voltage drops linearly against the rising of temperature. The deviation from the linear component ΔVTD1 is represented by the dotted line arrow and indicates a deviation from the linear component. Temperature-related fluctuations of the threshold voltage VTE of the enhancement NMOS transistor includes a linear component VTE1 and a deviation from the linear component ΔVTE1. The linear component VTE1 is represented by the dotted line having a constant slope along which the threshold voltage drops linearly in relation to the rising of temperature. The deviation from the linear component ΔVTD1 is represented by the dotted line arrow and indicates a deviation from the linear component. When the threshold voltages of the depletion NMOS transistor and the enhancement NMOS transistor behave completely the same way against temperature, temperature-related fluctuations of the transistors cancel when gmD/gmE equals 1 based on Expression (3), and the reference voltage Vref provided from the reference voltage generation device 100 consequently undergoes no temperature-related fluctuation.

Polarity of the channel impurity region 16 of the depletion NMOS transistor 10 and polarity of the channel impurity region 26 of the enhancement NMOS transistor 20 are both N type and, when the channel impurity regions have the same impurity concentration, the extension of depletion layers formed in the channel impurity regions and the Fermi levels exhibit the same tendency with the linear components. On the other hand, the depletion NMOS transistor 10 and the enhancement NMOS transistor 20 exhibit tendencies opposite to each other in temperature-related fluctuations with regards to a flat band voltage Vfbn which is included in the first threshold voltage VTD of the depletion NMOS transistor 10, and a flat band voltage Vfbp which is included in the second threshold voltage VTE of the enhancement NMOS transistor 20, because the gate electrode 15 of the N+ type and the gate electrode 25 of the P+ type have polarities opposite to each other. The linear component VTD1 of the depletion NMOS transistor in FIG. 3 is accordingly gentler in slope than the linear component VTE1 of the enhancement NMOS transistor. By the presence of those temperature-related fluctuations of the flat band voltages, the reference voltage Vref of Expression (3) undergoes temperature-related fluctuations in which Vref drops against a rise in temperature even when the reference voltage generation device is constructed from a combination of a depletion NMOS transistor and an enhancement NMOS transistor that have the same conditions except the condition about the gate electrode.

This embodiment first addresses how to decrease the slope of the linear component in such a reference voltage Vref by adjusting the channel size ratio (SD/SE) which is included in gmD/gmE of Expression (3). The channel size ratio is adjusted to a value larger than 1 and equal to or less than 3, though it may vary depending on the concentrations of impurities contained in the gate electrode 15 of the N+ type and the gate electrode 25 of the P+ type, to thereby increase the temperature-related fluctuation component expressed in the second term on the right side of Expression (3) and decrease the slope of the linear component of the reference voltage Vref. For instance, the channel size ratio (SD/SE) is adjusted to 2 by setting the channel length of the depletion NMOS transistor 10 to 100 μm, setting the channel length of the enhancement NMOS transistor 20 to 200 μm, and causing the channel widths of the transistors to be equal to each other.

Figure 4:
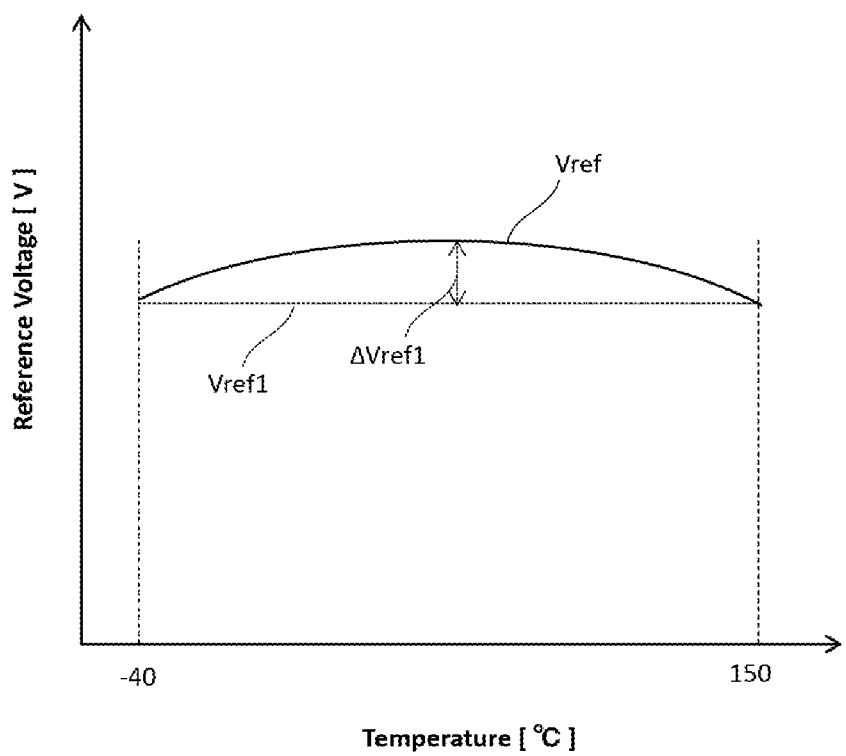
FIG. 4 is a graph for showing temperature characteristics of a reference voltage that is output by a reference voltage generation device of the related art.

When the channel size ratio (SD/SE) is increased, on the other hand, the deviation from the linear component of the reference voltage Vref increases. This is because the deviation from the linear component ΔVTD1 expressed in the second term on the right side of Expression (3) is amplified by increasing the channel size ratio. The temperature characteristics of the reference voltage Vref in this case have, for example, a linear component Vref1 having a slope decreased by correction within a range of from −40° C. to 150° C., and a deviation from the linear component ΔVref1 which is increased by the adjustment of the channel size ratio, as shown in FIG. 4 which is a graph for showing temperature-related fluctuations in the related art.

Figure 5:
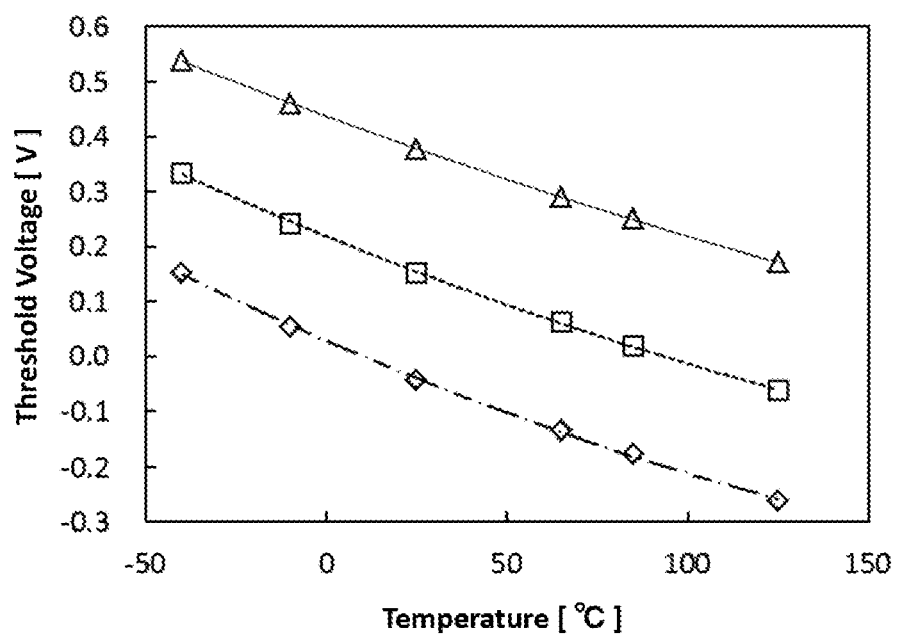
FIG. 5 is a graph for showing temperature characteristics of a threshold voltage of an enhancement NMOS transistor in the embodiment of the present invention.

The inventor of the present invention has found that the deviation from the linear component ΔVref1 described above can be controlled by changing the impurity concentration NE of the channel impurity region in the enhancement NMOS transistor. FIG. 5 is a graph for showing temperature-related fluctuations of the threshold voltage that are observed when the impurity concentration NE of the N type channel impurity region 26 is changed in the enhancement NMOS transistor 20 which has a gate electrode of the P+ type. When the N type channel impurity concentration NE is increased in relation to characteristics represented by the solid line, the threshold voltage drops as indicated by the dotted line, and the deviation from the linear component increases. A further increase in N type channel impurity concentration NE causes the threshold voltage to drop even lower as indicated by the dot-dash line and the deviation from the linear component to increase even more.

For that reason, this embodiment follows the changing of the channel size ratio (SD/SE) up with the increasing of the deviation from the linear component expressed in the first term on the right side of Expression (3) by increasing the impurity concentration NE of the channel impurity region 26 of the enhancement NMOS transistor 20 which has a gate electrode of the P+ type relative to the impurity concentration ND. The increased deviation from the linear component of the first term on the right side of Expression (3) cancels the increased deviation from the linear component of the second term on the right side of Expression (3) which has been caused by the adjustment of the channel size ratio (SD/SE). The of the reference voltage Vref can thus be reduced, and a reference voltage generation device reduced in temperature-related fluctuations of the reference voltage is implemented in which the reduction of the deviation from the linear component ΔVref1 is accomplished as well as the decrease of the slope of the linear component Vref1 of the reference voltage Vref.

Figure 6:
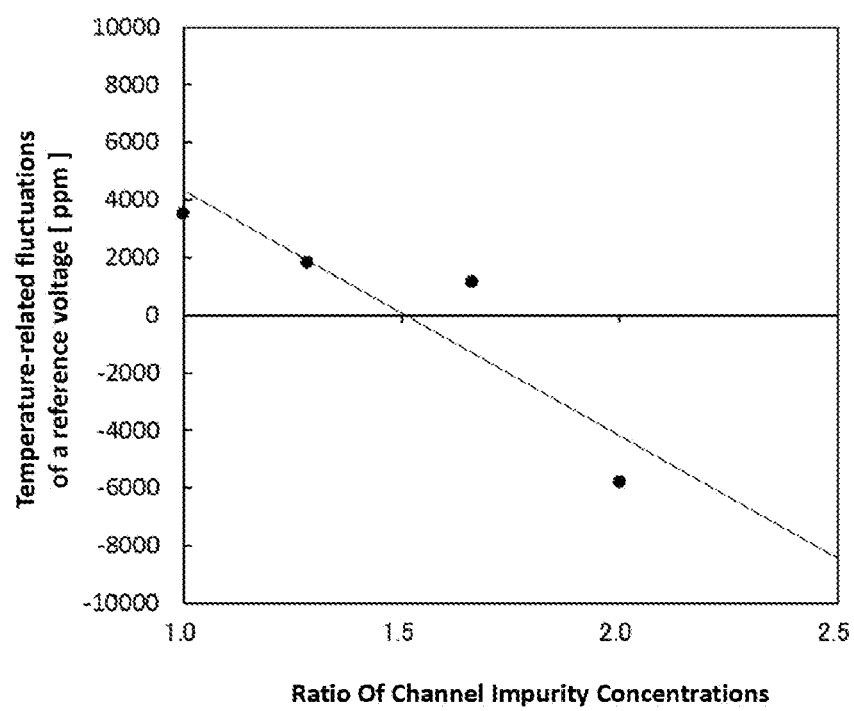
FIG. 6 is a graph for showing temperature-related fluctuations of a reference voltage in relation to the ratio of channel impurity concentrations in the reference voltage generation device according to the embodiment of the present invention.

FIG. 6 is a graph for showing the tendency of the deviation from the linear component ΔVref1 of the reference voltage Vref against the ratio of the impurity concentrations (NE/ND). At each point plotted in the graph, the slope of the linear component Vref1 of the reference voltage Vref is minimized in advance by adjusting the channel size ratio (SD/SE) of the depletion NMOS transistor 10 and the enhancement NMOS transistor 20.

As shown in FIG. 6, the deviation from the linear component ΔVref1 of the reference voltage Vref can be reduced by controlling the impurity concentration ratio of the channel impurity regions of the transistors. A preferred value of the impurity concentration ratio (NE/ND) of the channel impurity regions in order to reduce the deviation from the linear component ΔVref1 satisfactorily is more than 1 and equal to or less than 3, though it may vary depending on the thickness of the gate insulating films 12 and 22, the impurity concentrations of the gate electrodes 15 and 25, and other factors. In the example of FIG. 6, the deviation from the linear component ΔVref1 of the reference voltage Vref can be reduced by setting the impurity concentration ratio (NE/ND) to a value larger than 1 and equal to or less than 2.3, compared to the structure of the related art in which the impurity concentration ratio is 1.

As described above, the slope of the linear component Vref1 and the deviation from the linear component ΔVref1 of the reference voltage Vref output from the reference voltage generation device 100 can be decreased by combining the adjustment of the channel size ratio (SD/SE) and the adjustment of the impurity concentration ratio (NE/ND) of the channel impurity regions.

The amount of adjustment made to the channel size ratio (SD/SE) to change the slope of the linear component Vref1 of the reference voltage Vref and the amount of adjustment made to the impurity concentration ratio (NE/ND) of the channel impurity regions to change the deviation from the linear component take values close to each other. For instance, when the channel size ratio is set to a value larger than 1, the impurity concentration ratio of the channel impurity regions is also a value larger than 1. The two adjustment amounts are thus correlated and take substantially the same value.

A change to the impurity concentration of a channel impurity region changes the temperature dependency of the Fermi level which is determined by the impurity concentration. When the impurity concentration is constant throughout the semiconductor substrate, however, the deviation from the linear component is little. In a channel impurity region formed by ion implantation or a similar method, the impurity concentration is not constant and varies greatly within the channel impurity region. The degree of variation in impurity concentration is more prominent as the amount of impurity implanted is larger. It is surmised that an increase in impurity concentration increases the impurity concentration variation in a depletion layer which is formed by voltage application, and consequently causes the depletion layer to extend non-linearly in relation to temperature. The increased impurity concentration is thought to increase a non-linear component of temperature-related fluctuations of the Fermi level which is determined by the impurity concentration, as well.

In Japanese Patent Application Laid-open No. 2003-31678, the enhancement MOS transistor with a surface channel includes a P type channel impurity region which has the same polarity as the P type well region. The impurity concentration of this channel impurity region is lower approximately by an order of magnitude than the impurity concentration of an N type channel impurity region included in the depletion MOS transistor with an buried channel. Because in order to stably form the N type channel impurity region on the opposite-polarity P type well region of the depletion MOS transistor with a buried channel, the impurity concentration of the channel impurity region should be set high. This makes the deviation from the linear component of the threshold voltage of the enhancement MOS transistor with a surface channel considerably smaller than the deviation from the linear component of the threshold voltage of the depletion MOS transistor with a buried channel. It is therefore difficult with this configuration to reduce the deviation from the linear component of the reference voltage.

The present invention is not limited to the above-mentioned embodiment, and it is understood that various modifications can be made thereto without departing from the gist of the present invention.

For example, while the embodiment described above uses the depletion NMOS transistor 10 in which the gate and the source are connected by a wire and the gate-source voltage VG is 0 V as the constant current circuit 101 included in the reference voltage generation device 100 of FIG. 1, the gate-source voltage VG is not required to be 0 V. In other words, the constant current circuit may employ a MOS transistor in which a constant voltage is input to the gate and a constant current is output.

In FIG. 2, the depletion NMOS transistor 10 and the enhancement NMOS transistor 20 of the embodiment described above are formed in separate P type well regions 11 and 21 in the N type semiconductor substrate 4. The depletion NMOS transistor 10 and the enhancement NMOS transistor 20 may also be formed in the same P type well region, or in a P type semiconductor substrate.

The constant current circuit and the voltage generation circuit are not required to be a depletion NMOS transistor and an enhancement NMOS transistor, respectively, as long as the reference voltage generation device is configured so as to generate a constant reference voltage based on the value of a constant current that is output by a constant current circuit and input to a voltage generation circuit. For example, P-channel MOS (abbreviated as PMOS) transistors may be used. One of the depletion MOS transistor and the enhancement MOS transistor may be an NMOS transistor while the other is a PMOS transistor.

Figure 7:
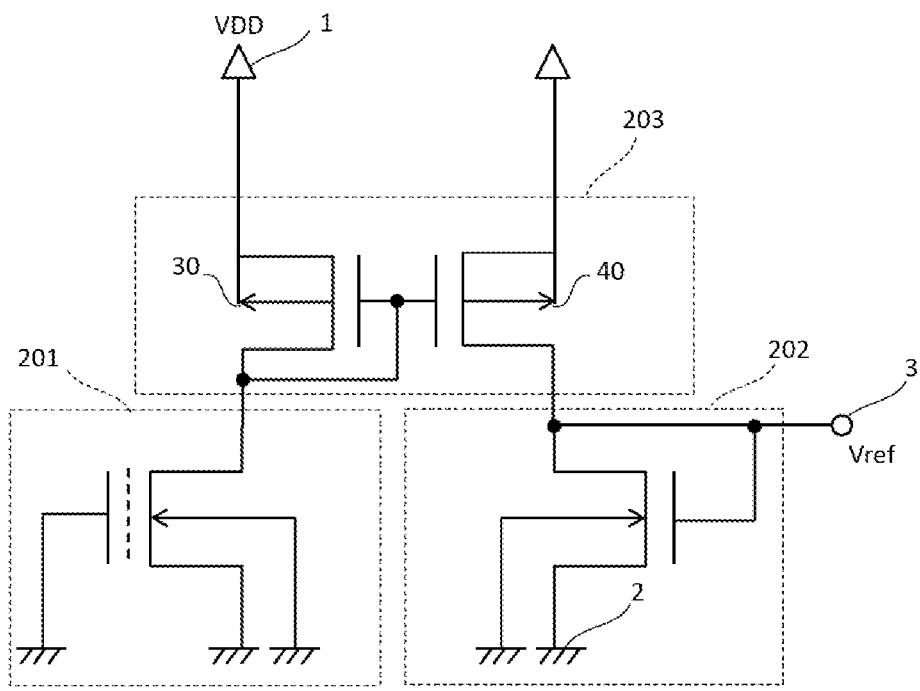
FIG. 7 is another circuit diagram for illustrating the reference voltage generation device according to the embodiment of the present invention.

The circuit configuration of a reference voltage generation device 200 illustrated in FIG. 7 may be employed in which a constant current is output from a constant current circuit 201 to a voltage generation circuit 202 via a current mirror circuit 203 constructed by combining two PMOS transistors 30 and 40.

What is claimed is:

1. A reference voltage generation device, comprising:
   a constant current circuit configured to output a constant current in response to an input voltage; and
   a voltage generation circuit configured to generate a voltage based on the constant current,
   the constant current circuit comprising a first MOS transistor having a first channel size, a first gate electrode of a first conductivity type, a first source region of the first conductivity type, a first drain region of the first conductivity type, and a first channel impurity region of the first conductivity type,
   the voltage generation circuit comprising a second MOS transistor having a second channel size, a second gate electrode of a second conductivity type, a second source region of the first conductivity type, a second drain region of the first conductivity type, and a second channel impurity region of the first conductivity type, and
   the first channel size and the second channel size being different from each other, and the first channel impurity region and the second channel impurity region having different impurity concentrations,
   wherein a first ratio NE/ND of an impurity concentration NE of the second channel impurity region to an impurity concentration ND of the first channel impurity region, and a second ratio SD/SE of a first channel size SD to a second channel size SE, are both larger than 1 and equal to or less than 3.

2. The reference voltage generation device according to claim 1, wherein the first MOS transistor is a depletion MOS transistor, and the second MOS transistor is an enhancement MOS transistor.

\* \* \* \* \*